(12) United States Patent
Wang (10) Patent No.: US 12,360,138 B2
(45) Date of Patent: Jul. 15, 2025

(54) VOLTAGE DETECTION DEVICE AND METHOD FOR PREVENTING SYSTEM FAILURE

(71) Applicant: SigmaStar Technology Ltd., Fujian (CN)

(72) Inventor: Wei-Ping Wang, Taiwan (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 164 days.

(21) Appl. No.: 18/487,210

(22) Filed: Oct. 16, 2023

(65) Prior Publication Data
US 2024/0142498 A1   May 2, 2024

(30) Foreign Application Priority Data
Nov. 1, 2022  (CN) .......................... 202211358706.6

(51) Int. Cl.
*G01R 19/00* (2006.01)
(52) U.S. Cl.
CPC ............................... *G01R 19/0038* (2013.01)
(58) Field of Classification Search
CPC .......... G01R 19/0038; G01R 19/16566; G01R 19/16528; G01R 19/16552; G01R 19/16576; G01R 19/2506; G01R 19/2509; H02H 1/0007; H02H 3/006

USPC ................ 327/143, 142, 63, 20; 714/48, 22; 365/230.06, 189.05, 189.02, 230.02
See application file for complete search history.

(56) References Cited

U.S. PATENT DOCUMENTS

| 2014/0285239 A1* | 9/2014 | Zanetta | G01R 19/0038 327/63 |
| 2015/0185745 A1* | 7/2015 | Kim | G05F 1/613 327/541 |
| 2020/0202902 A1* | 6/2020 | Lee | G11C 5/145 |

\* cited by examiner

*Primary Examiner* — Douglas X Rodriguez
(74) *Attorney, Agent, or Firm* — Edell, Shapiro & Finnan, LLC (57) ABSTRACT

A voltage detection device includes: a reference voltage latch circuit, outputting one of a first set of reference voltages and a second sets of reference voltages lower than the first set of reference voltages, as a third set of reference voltages according to a selection signal, and being selectively to be reset or to continue outputting the one of the first and second sets of reference voltages as the third set of reference voltages according to a first detection signal; a first voltage detector, generating the first detection signal according to a fourth set of reference voltages lower than or equal to the first set of reference voltages and an input voltage; a second voltage detector, generating a second detection signal according to the third set of reference voltages and the input voltage; and a digital circuit, generating the selection signal according to the second detection signal.

10 Claims, 5 Drawing Sheets

VOLTAGE DETECTION DEVICE AND METHOD FOR PREVENTING SYSTEM FAILURE

This application claims the benefit of China application Serial No. CN202211358706.6, filed on Nov. 1, 2022, the subject matter of which is incorporated herein by reference.

BACKGROUND OF THE INVENTION

Field of the Invention

The present application relates to a voltage detection device, and more particularly, to a voltage detection device capable of preventing failure of an electronic circuit caused by a sudden shutdown and a method for preventing system failure.

Description of the Related Art

In current electronic devices, if an instantaneous voltage drop in a power supply voltage or an internal voltage is generated due to factors such as a sudden shutdown, failure or operation errors of electronic circuits or circuit systems in the electronic device may be resulted. In the prior art, one single set of reference voltages are used to detect whether a voltage drop occurs in the power supply voltage or the internal voltage. However, in case that the voltage is not significant enough, the voltage detection mechanism above may be unable to correctly determine the voltage anomaly, such that failure of the electronic circuits and/or circuit systems may still be resulted.

SUMMARY OF THE INVENTION

In some embodiments, it is an object of the present application to provide a voltage detection device and a method for preventing system failure capable of improving voltage detection accuracy so as to overcome the issues of the prior art.

In some embodiments, a voltage detection device includes a reference voltage latch circuit, first and second voltage detectors and a digital circuit. The reference voltage latch circuit outputs one of first and second sets of reference voltages as a third set of reference voltages according to a selection signal, and is selectively to be reset or to continue outputting the one of the first and second sets of reference voltages as the third set of reference voltages according to a first detection signal, wherein the first set of reference voltages are lower than the second set of reference voltages. The first voltage detector generates the first detection signal according to a fourth set of reference voltages and an input voltage, wherein the fourth set of reference voltages are lower than or equal to the first set of reference voltages. The second voltage detector generates a second detection signal according to the third set of reference voltages and the input voltage. The digital circuit generates the selection signal according to the second detection signal.

In some embodiments, the method for preventing system failure includes operations of: outputting, by a reference voltage latch circuit, one of a first set of reference voltages and a second set of reference voltages as a third set of reference voltages according to a selection signal, wherein the first set of reference voltages are lower than the second set of reference voltages; selectively performing resetting the reference voltage latch circuit, or continuing outputting, by the reference voltage latch circuit, the one of the first set of reference voltages and the second set of reference voltages as the third set of reference voltages according to a first detection signal; comparing a fourth set of reference voltages with an input voltage to generate the first detection signal, wherein the input voltage is used to drive a circuit system and the fourth set of reference voltages are lower than or equal to the first set of reference voltages; comparing the third set of reference voltages with the input voltage to generate a second detection signal; and generating the selection signal according to the second detection signal.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
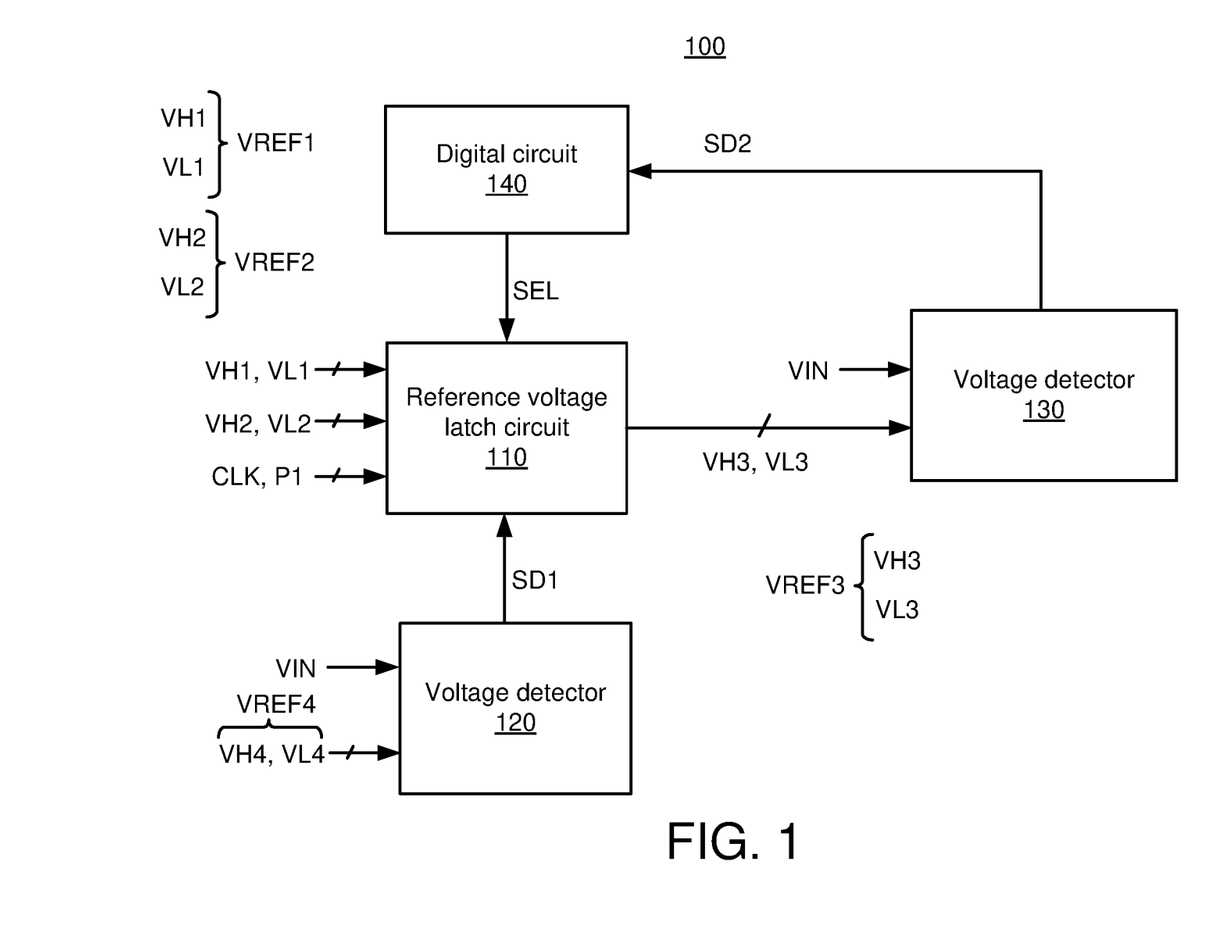
FIG. 1 is a schematic diagram of a voltage detection device according to some embodiments of the present application.

FIG. 1 shows a schematic diagram of a voltage detection device 100 according to some embodiments of the present application. In some embodiments, the voltage detection device 100 may detect an input voltage VIN to prevent circuit system failure occurring in the event of such as a sudden shutdown. In some embodiments, the input voltage VIN may be used to drive a circuit system. For example, the input voltage VIN may be, for example but not limited to, a supply voltage of a digital circuit system, or a driving voltage used by an input/output interface circuit system.

The voltage detection device 100 includes a reference voltage latch circuit 110, a voltage detector 120, a voltage detector 130 and a digital circuit 140. The reference voltage latch circuit 110 may output one of a first set of reference voltages VREF1 and a second set of reference voltages VREF2 as a third set of reference voltages VREF3 according to a selection signal SEL, wherein the first set of reference voltages VREF1 are lower than the second set of reference voltages VREF2. For example, the first set of reference voltages VREF1 include a voltage VH1 and a voltage VL1, and the second set of reference voltages VREF2 include a voltage VH2 and a voltage VL2. The voltage VH1 is higher than the voltage VL1 and lower than the voltage VH2, and the voltage VL2 is lower than the voltage VH2 and higher than the voltage VL1. For example, the voltage VH2 may be set to be approximately 1.58 V, the voltage VL2 may be set to be approximately 1.44 V, the voltage VH1 may be set to be approximately 1.34 V, and the voltage VL1 may be set to be approximately 1.3 V. It should be noted that the above numerical values of the voltages are merely examples, and the present application is not limited to these examples. The reference voltage latch circuit 110 may output the voltage VH1 and the voltage VL1 as a voltage VH3 and a voltage VL3 of the third set of reference voltages VREF3 according to the selection signal SEL, respectively, or output the voltage VH2 and the voltage VL2 as the voltage VH3 and the voltage VL3, respectively.

The reference voltage latch circuit 110 may store (or latch) the selection signal SEL as a switching signal (for example, a switching signal SW in FIG. 3) according to a clock signal CLK and a predetermined value P1 corresponding to the input voltage VIN, and output the third set of reference signals VREF3 according to the switching signal. Moreover, the reference voltage latch circuit 110 may be selectively to be reset according to a detection signal SD1, or to continue outputting the one of the first set of reference voltages VREF1 and the second set of reference voltages VREF2 as the third set of reference voltages VREF3. For example, if the detection signal SD1 indicates that the input voltage VIN is not lower than a fourth set of reference voltages VREF4 to be described below (for example, if the fourth set of reference voltages VREF4 are equal to the first set of reference voltages VREF1, the condition herein means that the input voltage VIN is not lower than a lower limit of the first set of reference voltages VREF1, that is, the voltage VL1), the reference voltage latch circuit 110 may continue outputting the set of reference voltages previous selected (for example, the second set of reference voltages VREF2) as the third set of reference voltages VREF3. Alternatively, if the detection signal SD1 indicates that the input voltage VIN is lower than the fourth set of reference voltages VREF4 to be described below (for example, if the fourth set of reference voltages VREF4 are equal to the first set of reference voltages VREF1, the condition herein means that the input voltage VIN is lower than the voltage VL1), the reference voltage latch circuit 110 may be reset so as to clear internal circuit settings to re-select set of reference voltages. Operation details related to the reference voltage latch circuit 110 are described with reference to FIG. 2 and/or FIG. 3 below.

The voltage detector 120 may compare the input voltage VIN with a fourth set of reference voltages VREF4 to generate the detection signal SD1. In some embodiments, if part of circuits in the system are configured to operate at a lower voltage, the fourth set of reference voltages VREF4 may be set to be lower than the first set of reference voltages VREF1; for example, an upper limit of the fourth set of reference voltages VREF4 is lower than the voltage VH1 and a lower limit of the fourth set of reference voltages VREF4 is lower than the voltage VL1. In some embodiments, the upper limit of the fourth set of reference voltages VREF4 may be set to be 0.6 to 0.9 (for example, to be approximately 0.75) times of the voltage VH1, and the lower limit of the fourth set of reference voltages VREF4 may be set to be 0.6 to 0.9 (for example, to be approximately 0.75) times of the voltage VL1. In some embodiments, the fourth set of reference voltage VREF4 may be set to be equal to the first set of reference voltages VREF1. For better understanding, in the embodiments to be described below, the fourth set of reference voltages VREF4 are equal to the first set of reference voltages VREF1 as an example; however, it should be noted that the present invention is not limited to the example. When the fourth set of reference voltages VREF4 are equal to the first set of reference voltages VREF1, the voltage detector 120 may compare the input voltage VIN with the first set of reference voltages VREF1 (in other embodiments, this may be replaced by another set of voltages lower than the first set of reference voltages VREF1) so as to generate the detection signal SD1. The detection signal SD1 may indicate whether the input voltage VIN is higher than the voltage VH1 or lower than the voltage VL1. Similarly, the voltage detector 130 may generate a detection signal SD2 according to the third set of reference voltages VREF3 and the input voltage VIN. For example, the voltage detector 130 may compare the input voltage VIN with the third set of reference voltages VREF3 to generate the detection signal SD2. The detection signal SD2 may indicate whether the input voltage VIN is higher than the voltage VH2 or lower than the voltage VL2. If the input voltage VIN is higher than the voltage VH2, it means that the input voltage VIN has risen to a target level and approximates a stable state.

The digital circuit 140 generates the selection signal SEL according to the second detection signal SD2. In some embodiments, the digital circuit 140 is further controlled by software (or firmware) in the system, so as to switch the selection signal SEL under a predetermined condition. In some embodiments, the digital circuit 140 is disposed in an electronic device including the voltage detection device 100, and is, for example, a control circuit or a central processor. In some embodiments, the digital circuit 140 may include registers storing control values or parameters, so as to control the operation of the voltage detection device 100. Associated details of the predetermined condition for switching the selection signal SEL are to be described with reference to FIG. 2 below.

Figure 2:
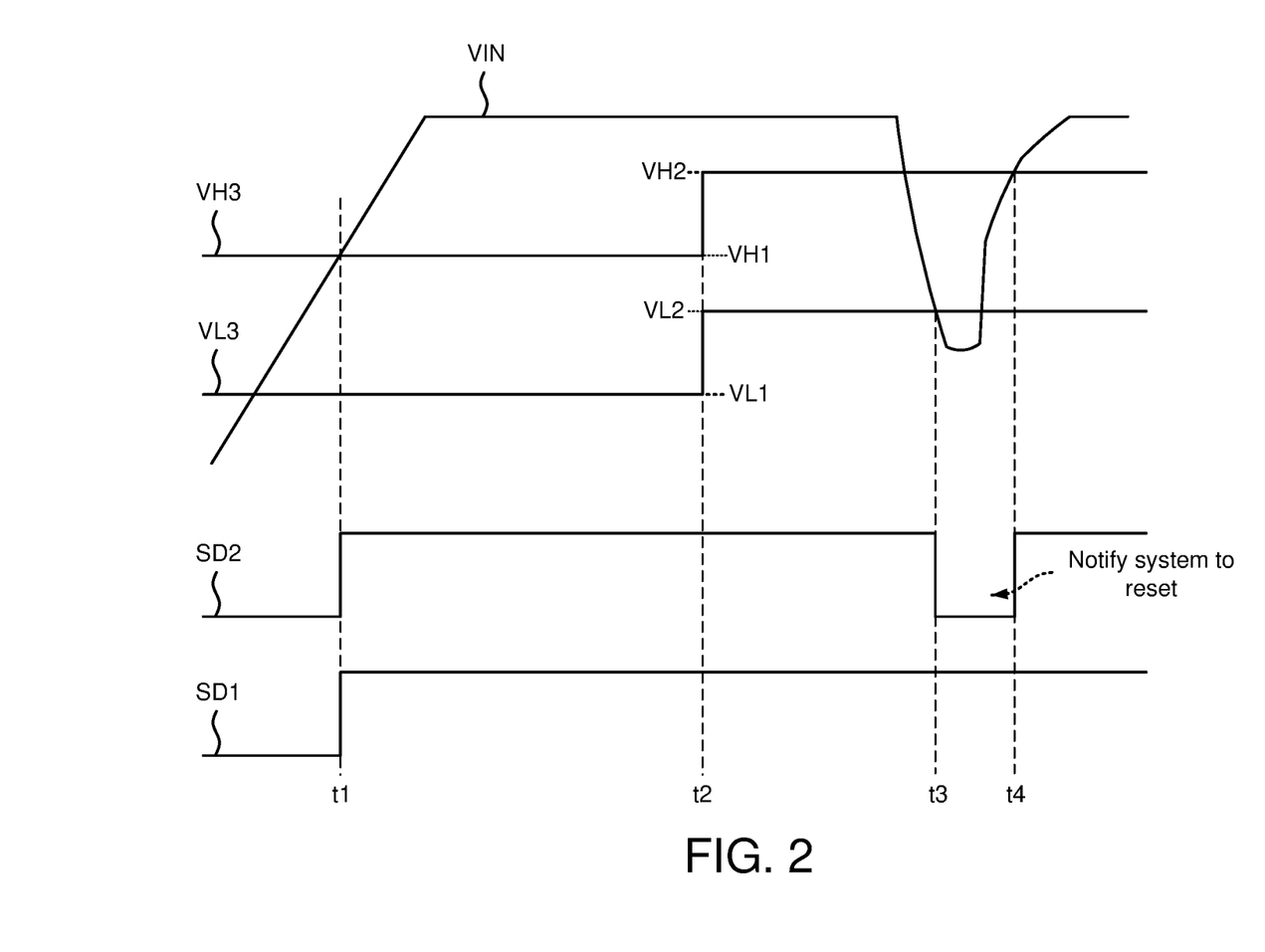
FIG. 2 is a waveform diagram of multiple signals in FIG. 1 according to some embodiments of the present application.

FIG. 2 shows a waveform diagram of multiple signals in FIG. 1 according to some embodiments of the present application. In an initial stage (for example, when the system is initially activated), the digital circuit 140 outputs the selection signal SEL (not shown) having a first value (for example, logic 0), such that the reference voltage latch circuit 110 outputs the first set of reference voltages VREF1 as the third set of reference voltages VREF3. In this case, the level of the voltage VH3 is equal to that of the voltage VH1, and the level of the voltage VL3 is equal to that of the voltage VL1. At a timing t1, the input voltage VIN begins to be higher than the voltage VH3, such that the detection signal SD1 and the detection signal SD2 both switch from a low level (corresponding to logic 0) to a high level (corresponding to logic 1). At a timing t2, with the control of software or firmware in the system, the digital circuit 140 outputs the selection signal SEL having a second value (for example, logic 1), such that the reference voltage latch circuit 110 switches to output the second set of reference voltages VREF2 as the third set of reference voltages VREF3 according to the selection signal SEL. In this case, the level of the voltage VH3 rises to that of the voltage VH2, and the level of the voltage VL3 rises to that of the voltage VL2. In other words, if the detection signal SD2 satisfies a predetermined condition (for example, the detection signal SD2 has a predetermined level (for example, a high level) within a predetermined period (for example, a period between the timing t1 and the timing t2) after the reference voltage latch circuit 110 outputs the first set of reference voltages VREF1 as the third set of reference voltages VREF3), the software or firmware in the system controls the digital circuit 140 to adjust the selection signal SEL, such that the reference voltage latch circuit 110 switches to output the second set of reference voltages VREF2 as the third set of reference voltages VREF3.

Next, at a timing t3, due to influences of factors such as a sudden shutdown, the input voltage VIN is lower than the voltage VL3 (for example, lower than the voltage VL2 but not lower than the voltage VL1). In this case, the detection signal SD2 switches to having a low level so as to notify the circuit system to be reset to further prevent failure of the circuit system. Meanwhile, because the input voltage VIN is not lower than the voltage VL1, the detection signal SD1 is still kept at a high level. In this case, the reference voltage latch circuit 110 may continue outputting the second set of reference voltages VREE2 as the third set of reference voltages VREF3. As such, it is ensured that an erroneous operation or failure of the circuit system resulted by a voltage drop of this voltage is not incurred. At a timing t4, the input voltage VIN is again higher than the voltage VH3, such that the detection signal SD2 switches to be at a high level. Thus, the circuit system may continue the original operation. On the other hand, if the input voltage VIN is lower than the voltage VL3 and the voltage VL1 at the timing t3, the detection signal SD1 and the detection signal SD2 are both switched to a low level. In this case, it means that the level of the input voltage VIN is too low, and the reference voltage latch circuit 110 may be reset (for example, clearing internal circuit settings) according to the detection signal SD1, so as to re-select a set of reference voltages in the next operation and accordingly output the third set of reference voltages VREF3.

In some related art, the voltage detection mechanism in an electronic device uses merely one set of reference voltages (for example, the second set of reference voltages VREF2) to determine whether an input voltage suddenly drops. However, if the voltage drop of the input voltage is not significant enough (for example, the input voltage VIN is lower than the voltage VH2 but higher than the voltage VL2), the voltage detection mechanism may still mistakenly determine that the input voltage has a normal level and hence does not perform other operations. In fact, failure of the actual circuit system or an error signal may be resulted because of such voltage drop. Compared to the art above, in some embodiments of the present invention, the voltage detection device 100 uses two sets of reference voltages, and switches to use a reference voltage having a higher level within a period after power-on so as to determine whether the above voltage drops occurs in the input voltage VIN. As such, whether a voltage drop occurs in the input voltage VIN can be more accurately determined to thereby prevent system failure.

Figure 3:
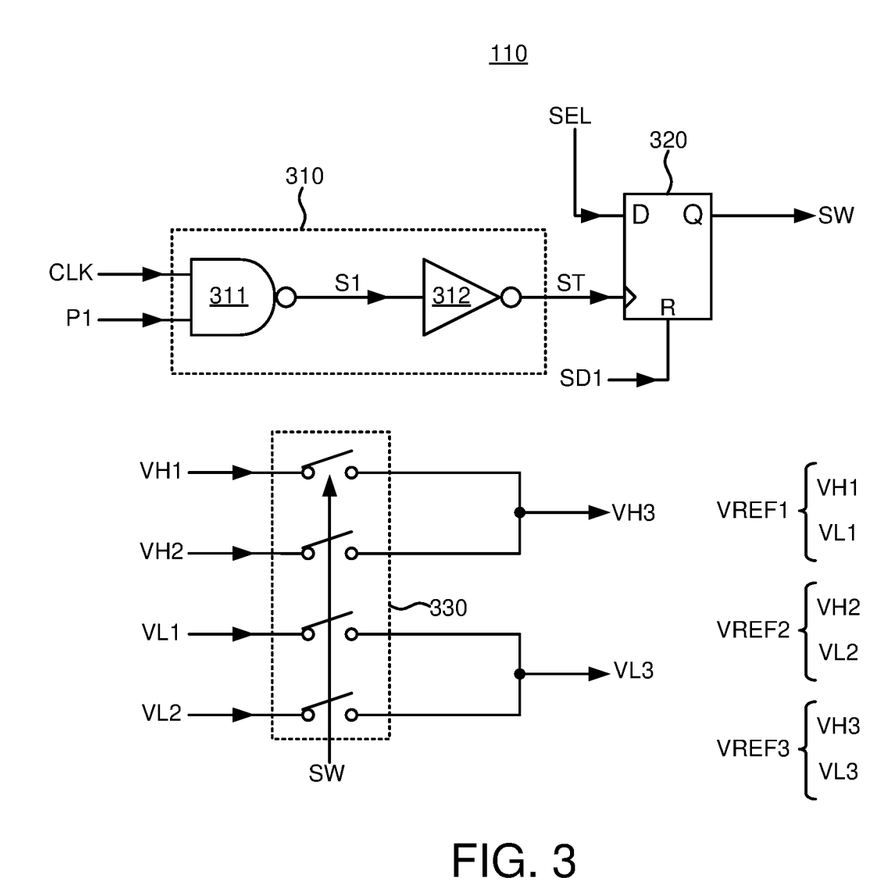
FIG. 3 is a schematic diagram of a reference voltage latch circuit in FIG. 1 according to some embodiments of the present application.

FIG. 3 shows a schematic diagram of the reference voltage latch circuit 110 in FIG. 1 according to some embodiments of the present application. The reference voltage latch circuit 110 includes a trigger 310, a flip-flop 320 and a multiplexer 330. The trigger 310 generates a trigger signal ST according to the clock signal CLK and the predetermined value P1. In some embodiments, the predetermined value P1 may be a target level of the input voltage VIN. For example, if the input voltage VIN is predetermined to be 1.8 V at a stable state, the predetermined value P1 may be 1.8 V. The trigger 310 includes a NAND gate 311 and an inverter 312. The NAND gate 311 generates a signal S1 according to the clock signal CLK and the predetermined value P1. The inverter 312 generates a trigger signal ST according to the signal S1.

The flip-flop 320 outputs the selection signal SEL as the switching signal SW according to the trigger signal ST, and selectively continues outputting the selection signal SEL as the switching signal SW or resets the switching signal SW according to the detection signal SD1. For example, the flip-flop 320 may be a D flip-flop having a reset input terminal (denoted as R), wherein the reset input terminal receives the detection signal SD1. When the detection signal SD1 has a high level, the flip-flop 320 may sequentially output the selection signal SEL as the switching signal SW according to the trigger signal ST. When the detection signal SD1 has a low level, the flip-flop 320 may reset the switching signal SW (for example, resetting the signal value of the switching signal SW to logic 0). On the other hand, as shown in FIG. 2, when the input voltage VIN is lower than the voltage VL2 but not lower than the voltage VL1, the detection signal SD1 still has a high level. As such, the flip-flop 320 may continue outputting the selection signal SEL as the switching signal SW according to the trigger signal ST. In other words, when the input voltage VIN is not too low (that is, not lower than the voltage VL1), the flip-flop 320 may continue latching the selection signal SEL as the switching signal SW. When the input voltage VIN becomes too low (that is, lower than the voltage VL1), the detection signal SD1 has a low level such that the flip-flop 320 resets the signal value of the switching signal SW.

The multiplexer 330 may output the first set of reference voltages VREF1 or the second set of reference voltages VREF2 as the third set of reference voltages VREF3 according to the switching signal SW. For example, the multiplexer 330 includes multiple switches. Part of the switches are turned on when the switching signal SW is logic 0 so as to output the voltage VH1 as the voltage VH3 and to output the voltage VL1 as the voltage VL3. The remaining part of the switches are turned on when the switching signal SW is logic 1 so as to output the voltage VH2 as the voltage VH3 and to output the voltage VL2 as the voltage VL3.

Figure 4:
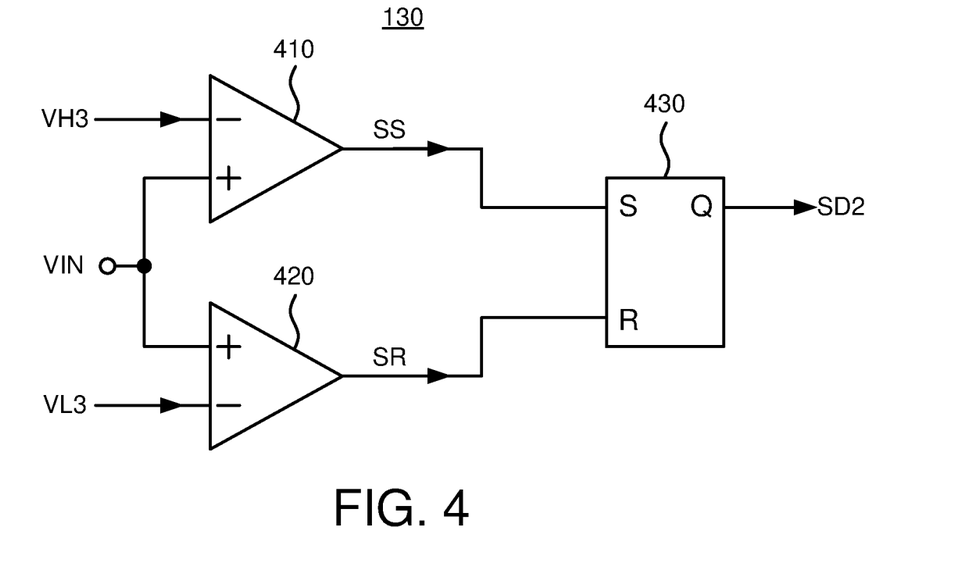
FIG. 4 is a schematic diagram of a voltage detector in FIG. 1 according to some embodiments of the present application.

FIG. 4 shows a schematic diagram of the voltage detector 130 in FIG. 1 according to some embodiments of the present application. In this example, the voltage detector 130 includes a comparator 410, a comparator 420 and a latch 430. The comparator 410 may compare the input voltage VIN with the voltage VH3 to generate a setting signal SS. The comparator 420 may compare the input voltage VIN with the voltage VL3 to generate a reset signal SR. The latch 430 may generate the detection signal SD2 according to the setting signal SS and the reset signal SR. For example, the latch 430 may be an S-R latch, which is configured to have an input terminal thereof (denoted as S) receive the setting signal SS and a reset input terminal thereof (denoted as R) receive the reset signal SR. As such, when the input voltage VIN is higher than the voltage VH3, the latch 430 may output the detection signal SD2 having a high level. Or, when the input voltage VIN is lower than the voltage VL3, the latch 430 may output the detection signal SD2 having a low level.

Figure 5:
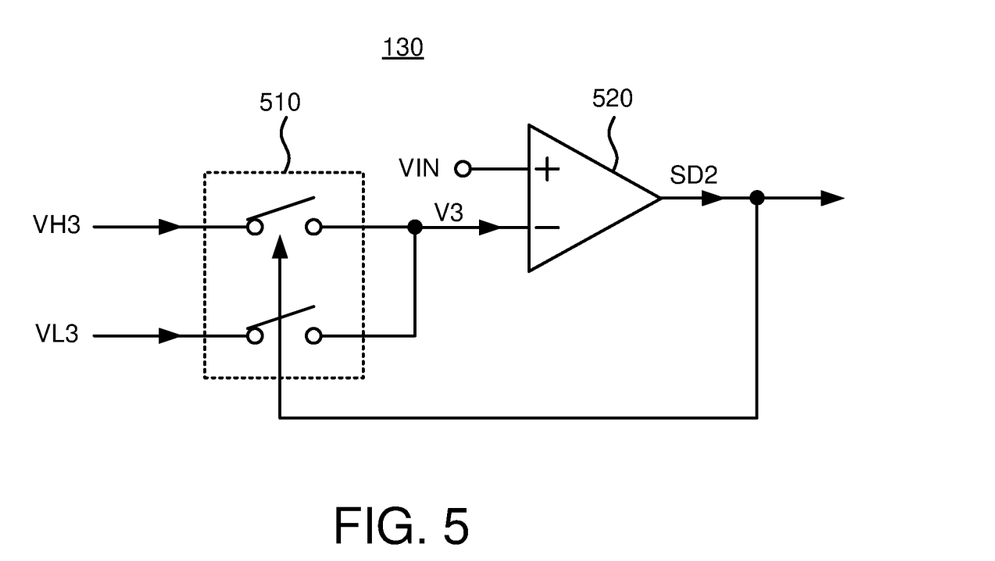
FIG. 5 is a schematic diagram of a voltage detector in FIG. 1 according to some embodiments of the present application.

FIG. 5 shows a schematic diagram of the voltage detector 130 in FIG. 1 according to some embodiments of the present application. In this example, the voltage detector 130 includes a multiplexer 510 and a comparator 520. The multiplexer 510 selectively outputs the voltage VH3 or the voltage VL3 as a voltage V3 according to the detection signal SD2. For example, the multiplexer 510 includes a first switch and a second switch. When the detection signal SD1 has a low level (or example, logic 0), the first switch is turned on so as to output the voltage VH3 as the voltage V3. Or, when the detection signal SD1 has a high level (or example, logic 1), the second switch is turned on so as to output the voltage VL3 as the voltage V3. The comparator 520 may compare the input voltage VIN with the voltage V3 to generate the detection signal SD2. As such, the detection signal SD2 may have a high level when the input voltage VIN is higher than the voltage VH3. Or, the detection signal SD2 may have a low level when the input voltage VIN is lower than the voltage VL3.

In some embodiments, the implementation of the voltage detector 120 may be referred from the voltage detectors 130 in FIG. 4 and FIG. 5. For example, to implement the voltage detector 120, the voltage VH3 in FIG. 4 and FIG. 5 may be replaced by the voltage VH1 and the voltage VL3 may be replaced by the voltage VL1 (or replaced by another set of reference voltages lower than the first set of reference voltages VREF1). Other operation and configuration details are the same as those of the examples in FIG. 4 and FIG. 5, and are omitted herein for brevity.

Figure 6:
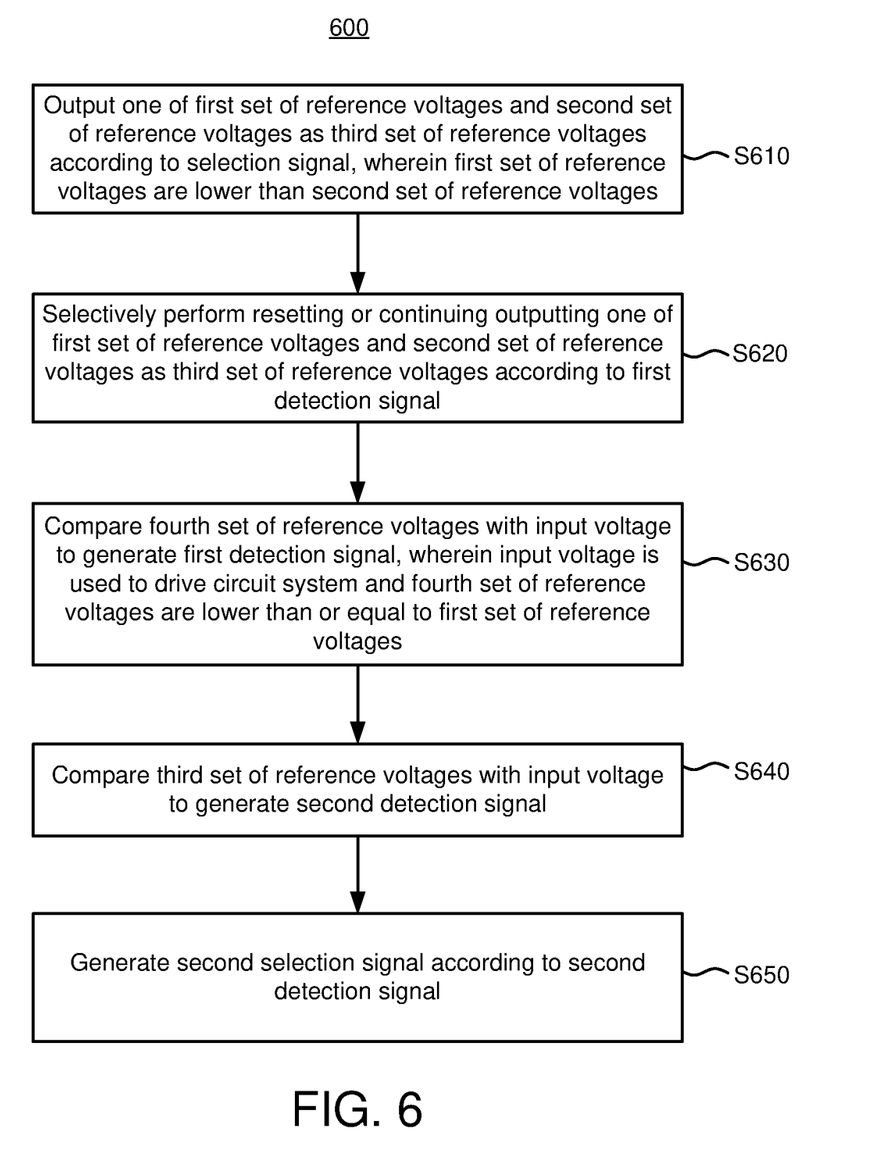
FIG. 6 is a flowchart of a method for preventing system failure according to some embodiments of the present application.

FIG. 6 shows a flowchart of a method 600 for preventing system failure according to some embodiments of the present application. In operation S610, one of a first set of reference voltages and a second set of reference voltages are output as a third set of reference voltages according to a selection signal, wherein the first set of reference voltages are lower than the second set of reference voltages. In operation S620, resetting or continuing outputting the one of the first set of reference voltages and the second set of reference voltages as the third set of reference voltages is selectively performed according to a first detection signal. In operation S630, a fourth set of reference voltages are compared with an input voltage to generate the first detection signal, wherein the input voltage is used to drive a circuit system and the fourth set of reference voltages are lower than or equal to the first set of reference voltages. In operation S640, the third set of reference voltages are compared with the input voltage to generate a second detection signal. In operation S650, a selection signal is generated according to the second detection signal.

The details of the plurality of operations above may be referred from the description associated with the foregoing embodiments, and are omitted herein for brevity. The plurality operations of the above method 600 for preventing system failure are merely examples, and are not limited to being performed in the order specified in these examples. Without departing from the operation means and ranges of the various embodiments of the present application, additions, replacements, substitutions or omissions may be made to the operations of the method 600 for preventing system failure, or the operations may be performed in different orders (for example, simultaneously performed or partially simultaneously performed).

In conclusion, the voltage detection device and the method for preventing system failure in some embodiments of the present invention are capable of improving voltage detection accuracy by using multiple sets of reference voltages, and latching a currently used reference voltage by using a circuit concept such as a latch circuit. Thus, it is ensured that the circuit system can be correctly reset in the event of a sudden voltage drop, thereby ensuring that failure in operations of the circuit system is not resulted.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. A voltage detection device, comprising:
   a reference voltage latch circuit, outputting one of first and second sets of reference voltages as a third set of reference voltages according to a selection signal, and selectively resetting or continuing outputting the one of the first and second sets of reference voltages as the third set of reference voltages according to a first detection signal, wherein the first set of reference voltages are lower than the second set of reference voltages;
   a first voltage detector, generating the first detection signal according to a fourth set of reference voltages and an input voltage, wherein the fourth set of reference voltages are lower than or equal to the first set of reference voltages;
   a second voltage detector, generating a second detection signal according to the third set of reference voltages and the input voltage; and
   a digital circuit, generating the selection signal according to the second detection signal.

2. The voltage detection device according to claim 1, wherein if the first detection signal indicates that the input voltage is not lower than the fourth set of reference voltages, the reference voltage latch circuit continues outputting the one of the first set of reference voltages and the second set of reference voltages as the third set of reference voltages.

3. The voltage detection device according to claim 1, wherein if the first detection signal indicates that the input voltage is lower than the fourth set of reference voltages, the reference voltage latch circuit is reset.

4. The voltage detection device according to claim 1, wherein if the second detection signal has a predetermined level within a predetermined period after the first set of reference voltages are output as the third set of reference voltages, the reference voltage latch circuit switches to output the second set of reference voltages as the third set of reference voltages according to the selection signal.

5. The voltage detection device according to claim 1, wherein the reference voltage latch circuit further stores the selection signal as a switching signal according to a clock signal and a predetermined value corresponding to the input voltage, and outputs the third set of reference voltages according to the switching signal.

6. The voltage detection device according to claim 1, wherein the reference voltage latch circuit comprises:
- a trigger, generating a trigger signal according to a clock signal and a predetermined value corresponding to the input voltage,
- a flip-flop, outputting the selection signal as a switching signal according to the trigger signal, and resetting the switching signal according to the first detection signal; and
- a multiplexer, outputting the one of the first set of reference voltages and the second set of reference voltages as the third set of reference voltages according to the switching signal.

7. The voltage detection device according to claim 6, wherein the trigger comprises:
- a NAND gate, generating a first signal according to the clock signal and the predetermined value; and
- an inverter, generating the trigger signal according to the first signal.

8. The voltage detection device according to claim 1, wherein the second voltage detector comprises:
- a first comparator, comparing the input voltage with a first voltage in the third set of reference voltages to generate a setting signal;
- a second comparator, comparing the input voltage with a second voltage in the third set of reference voltages to generate a reset signal, wherein the first voltage is higher than the second voltage; and
- a latch, generating the second detection signal according to the setting signal and the reset signal.

9. The voltage detection device according to claim 1, wherein the second voltage detector comprises:
- a multiplexer, selectively outputting one of a first voltage and a second voltage in the third set of reference voltages as a third voltage according to the second detection signal, wherein the first voltage is higher than the second voltage; and
- a comparator, comparing the input voltage with the third voltage to generate the second detection signal.

10. A method for preventing system failure, comprising:
- outputting, by a reference voltage latch circuit, one of a first set of reference voltages and a second set of reference voltages as a third set of reference voltages according to a selection signal, wherein the first set of reference voltages are lower than the second set of reference voltages;
- selectively performing resetting the reference voltage latch circuit or continuing outputting, by the reference voltage latch circuit, the one of the first set of reference voltages and the second set of reference voltages as the third set of reference voltages according to a first detection signal;
- comparing a fourth set of reference voltages with an input voltage to generate the first detection signal, wherein the input voltage is used to drive a circuit system and the fourth set of reference voltages are lower than or equal to the first set of reference voltages;
- comparing the third set of reference voltages with the input voltage to generate a second detection signal; and
- generating the selection signal according to the second detection signal.

* * * * *